(12) United States Patent
Anémian et al.

(10) Patent No.: US 9,534,077 B2
(45) Date of Patent: Jan. 3, 2017

(54) ELECTROLUMINESCENT POLYMERS, PROCESS FOR THE PREPARATION THEREOF, AND USE THEREOF

(75) Inventors: Rémi Manouk Anémian, Seoul (KR); Aurélie Ludemann, Frankfurt am Main (DE); Junyou Pan, Frankfurt am Main (DE)

(73) Assignee: Merck Patent GmbH (DE)

( * ) Notice: Subject to any disclaimer, the term of this patent is extended or adjusted under 35 U.S.C. 154(b) by 795 days.

(21) Appl. No.: 13/578,439

(22) PCT Filed: Jan. 18, 2011

(86) PCT No.: PCT/EP2011/000190
§ 371 (c)(1),
(2), (4) Date: Aug. 10, 2012

(87) PCT Pub. No.: WO2011/098205
PCT Pub. Date: Aug. 18, 2011

(65) Prior Publication Data
US 2012/0305852 A1 Dec. 6, 2012

(30) Foreign Application Priority Data
Feb. 12, 2010 (DE) .......... 10 2010 007 938

(51) Int. Cl.
| | |
|---|---|
| H01L 51/54 | (2006.01) |
| C09K 11/06 | (2006.01) |
| C08G 61/12 | (2006.01) |
| H01L 51/00 | (2006.01) |
| H05B 33/14 | (2006.01) |
| H01L 51/50 | (2006.01) |

(52) U.S. Cl.
CPC .............. C08G 61/12 (2013.01); C09K 11/06 (2013.01); H01L 51/0039 (2013.01); H01L 51/0043 (2013.01); H05B 33/14 (2013.01); C08G 2261/18 (2013.01); C08G 2261/19 (2013.01); C08G 2261/226 (2013.01); C08G 2261/228 (2013.01); C08G 2261/3142 (2013.01); C08G 2261/3162 (2013.01); C08G 2261/411 (2013.01); C09K 2211/1416 (2013.01); C09K 2211/1433 (2013.01); H01L 51/5012 (2013.01); Y02E 10/549 (2013.01)

(58) Field of Classification Search
None
See application file for complete search history.

(56) References Cited

U.S. PATENT DOCUMENTS

| | | | |
|---|---|---|---|
| 2003/0091862 A1* | 5/2003 | Tokito ................ | C08G 61/02 428/690 |
| 2004/0204557 A1* | 10/2004 | Uckert ................ | C08G 61/02 528/4 |
| 2007/0027299 A1* | 2/2007 | Morishita .......... | C08G 73/0688 528/423 |
| 2008/0102312 A1* | 5/2008 | Parham et al. ............... | 428/704 |
| 2008/0145708 A1 | 6/2008 | Heil et al. | |
| 2009/0261717 A1* | 10/2009 | Buesing ................ | C07C 13/62 313/504 |
| 2011/0042661 A1* | 2/2011 | Endo et al. ..................... | 257/40 |

FOREIGN PATENT DOCUMENTS

| | | |
|---|---|---|
| JP | 2009043896 A * | 2/2009 |
| WO | WO-2006/0108497 A1 | 10/2006 |
| WO | WO 2007086701 A1 * | 8/2007 |
| WO | WO-2009065479 A1 | 5/2009 |
| WO | WO 2009102027 A1 * | 8/2009 |

OTHER PUBLICATIONS

Lin et al. Tetrahedron Letters 2009, 50, 182-185. Date of on-line publication: Oct. 29, 2008.*
Machine translation of JP2009-043896. Date of publication: Feb. 26, 2009.*
International Search Report for PCT/EP2011/000190 mailed May 2, 2011.

* cited by examiner

*Primary Examiner* — Andrew K Bohaty
(74) *Attorney, Agent, or Firm* — Drinker Biddle & Reath LLP (57) ABSTRACT

The present invention relates to electroluminescent polymers which comprise indenofluorenarylamine derivatives as recurring units, to a process for the preparation thereof, to blends and formulations comprising these polymers, and to the use of these polymers or blends in electronic devices, in particular in organic light-emitting diodes, so-called OLEDs.

27 Claims, 1 Drawing Sheet

ELECTROLUMINESCENT POLYMERS, PROCESS FOR THE PREPARATION THEREOF, AND USE THEREOF

RELATED APPLICATIONS

This application is a national stage application (under 35 U.S.C. §371) of PCT/EP2011/000190, filed Jan. 18, 2011, which claims benefit of German Patent Application No. 10 2010 007 938.3, filed Feb. 12, 2010.

BACKGROUND OF THE INVENTION

The present invention relates to electroluminescent polymers which comprise indenofluorenarylamine derivatives as recurring unit, to a process for the preparation thereof, to blends and formulations comprising these polymers, and to the use of these polymers or blends in electronic devices, in particular in organic light-emitting diodes, so-called OLEDs. The polymers according to the invention exhibit improved efficiency and a longer lifetime, in particular on use in OLEDs.

Conjugated polymers have already been investigated intensively for a long time as highly promising materials in OLEDs. OLEDs which comprise polymers as organic materials are frequently also known as PLEDs (PLED=polymer light-emitting diode). Their simple preparation promises inexpensive production of corresponding light-emitting diodes.

Since PLEDs usually only consist of one light-emitting layer, polymers are required which are able as far as possible to combine all functions (charge injection, charge transport, recombination) of an OLED in themselves. In order to meet these requirements, different monomers which take on the corresponding functions are employed during the polymerisation. Thus, it is generally necessary, for the generation of all three emission colours, to copolymerise certain comonomers into the corresponding polymers (cf., for example, WO 00/46321 A1, WO 03/020790 A2 and WO 02/077060 A1). Thus, it is possible, for example, starting from a blue-emitting base polymer ("backbone"), to generate the other two primary colours red and green.

Various classes of material, such as, for example, poly-para-phenylenes (PPPs), have already been proposed or developed as polymers for full-colour display elements (full-colour displays). Thus, for example, polyfluorene, polyspirobifluorene, polyphenanthrene, polydihydrophenanthrene and polyindenofluorene derivatives come into consideration. Polymers which comprise a combination of the said structural elements have also already been proposed.

The most important criteria of an OLED are efficiency, colour and lifetime. Since these properties are crucially determined by the emitter(s) used, improvements in the emitters compared with the materials known from the prior art are still necessary.

In particular, the lifetime of green- and especially blue-emitting polymers is not yet ideal for many applications.

Polymers which comprise aryl-substituted trans-indeno-fluorene derivatives as recurring units are disclosed, for example, in WO 2004/041901 A1.

Polymers which comprise indenofluorenediamine derivatives as recurring units are likewise known. Such polymers are disclosed, for example, in WO 2005/104263 A1. A disadvantage of these polymers comprising indenofluorene-diamine units is that they only facilitate a pale-blue emission colour.

BRIEF SUMMARY OF THE INVENTION

One of the objects of the present invention was therefore to provide electroluminescent polymers which have improved efficiency and a longer lifetime and especially also facilitate a (deep) blue emission colour in the polymer. This object is achieved in accordance with the invention by the provision of electroluminescent polymers which comprise 0.01 to 100 mol % of one or more structural units of the formula (1).

Surprisingly, it has been found that electroluminescent polymers comprising structural units of the formula (1) have very good properties. In particular, they exhibit very high efficiencies and increase the lifetimes by several orders of magnitude compared with reference systems to date. The novel structural units are particularly suitable as emitter, but also, depending on the substitution pattern, as polymer backbone, hole conductor or electron conductor.

The present invention thus relates to polymers comprising 0.01 to 100 mol %, preferably 0.1 to 50 mol %, particularly preferably 0.5 to 25 mol %, of one or more structural units of the formula (1) and in particular 1 to 20 mol % of a structural unit of the formula (1), formula (1)

where the symbols and indices used have the following meanings:

$Ar^1$, $Ar^2$, $Ar^3$ is on each occurrence, identically or differently, a $C_6$-$C_{24}$-aryl or $C_2$-$C_{23}$-heteroaryl group having 5 to 24 aromatic ring atoms, which may be substituted by one or more radicals $R^1$;

Y is on each occurrence N, P, P=O, $PF_2$, P=S, As, As=O, As=S, Sb, Sb=O or Sb=S;

$Ar^4$, $Ar^5$ is on each occurrence, identically or differently, an aromatic or heteroaromatic ring system having 5 to 40 aromatic ring atoms, which may be substituted by one or more radicals $R^1$;

$R^1$ is on each occurrence, identically or differently, H, F, Cl, Br, I, CN, $NO_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S— or —$CONR^2$— and where one or more H atoms may be replaced by F, Cl, Br, I, CN or $NO_2$, or an aromatic or heteroaromatic ring system having 5 to 40 aromatic ring atoms, which may be substituted by one or more radicals $R^2$, or an aryloxy or heteroaryloxy group having 5 to 40 aromatic ring atoms, which may be substituted by one or more radicals $R^2$, or a combination of these systems; two or more substituents $R^1$ here may also form a mono- or polycyclic, aliphatic, aromatic or heteroaromatic ring system with one another;

$R^2$ is on each occurrence, identically or differently, H, an aliphatic hydrocarbon radical having 1 to 20 C atoms or an aromatic hydrocarbon radical having 6 to 20 C atoms;

$X^1$ is on each occurrence, identically or differently, a bridge which, with $Ar^1$ and $Ar^2$, forms a cyclic system selected from $B(R^1)$, $C(R^1)_2$, $Si(R^1)_2$, $C=O$, $C=NR^1$, $C=C(R^1)_2$, O, S, S=O, $SO_2$, $N(R^1)$, $P(R^1)$, $P(=O)R^1$, $P(=S)R^1$ or a combination of two, three or four of these groups;

$X^2$, $X^3$ is on each occurrence, identically or differently, a bridge which, with $Ar^2$ and $Ar^3$, forms a cyclic system selected from $B(R^1)$, $C(R^1)_2$, $Si(R^1)_2$, $C=O$, $C=NR^1$, $C=C(R^1)_2$, O, S, S=O, $SO_2$, $N(R^1)$, $P(R^1)$, $P(=O)R^1$, $P(=S)R^1$ or a combination of two, three or four of these groups;

n, o is on each occurrence, identically or differently, 0 or 1, with the proviso that the sum (n+o)=1;

and where the dashed lines denote the possible links in the polymer.

A DETAILED DESCRIPTION OF THE INVENTION

The structural units of the formula (1) here have at least one link, preferably two or three links, to the polymer. Preference is given to links via $Ar^4$ and $Ar^5$, via $Ar^1$ and $Ar^4$ or via $Ar^1$, $Ar^4$ and $Ar^5$. Preference is therefore given to polymers comprising 0.01 to 100 mol % of one or more structural units of the formula (2), (3) and/or (4).

formula (2)

formula (3)

formula (4)

The statements made in the present application relating to formula (1) apply in the same way to the preferred formulae (2), (3) and (4) and the other preferred embodiments.

In the present application, the term polymer is taken to mean both polymeric compounds, oligomeric compounds and dendrimers. The polymeric compounds according to the invention preferably have 10 to 10,000, particularly preferably 20 to 5000 and in particular 50 to 2000 recurring units.

The oligomeric compounds according to the invention preferably have 2 to 9 recurring units. The branching factor of the polymers here is between 0 (linear polymer, no branching points) and 1 (fully branched dendrimer).

The polymers according to the invention are either conjugated, partially conjugated or non-conjugated polymers. Conjugated or partially conjugated polymers are preferred.

The structural units of the formula (1) can, in accordance with the invention, be incorporated into the main chain or into the side chain of the polymer. On incorporation into the side chain, it is possible for the structural units of the formula (1) to be conjugated with the main polymer chain or for them to be non-conjugated with the main polymer chain. The structural units of the formula (1) are preferably incorporated into the main chain of the polymer.

"Conjugated polymers" in the sense of the present application are polymers which contain principally $sp^2$-hybridised (or optionally also sp-hybridised) carbon atoms in the main chain, which may also be replaced by corresponding heteroatoms. In the simplest case, this means the alternating presence of double and single bonds in the main chain, but also polymers comprising units such as, for example, meta-linked phenylene are intended to be regarded as conjugated polymers in the sense of this application. "Principally" means that naturally (involuntarily) occurring defects which result in conjugation interruptions do not devalue the term "conjugated polymer". Furthermore, the term conjugated is likewise used in this application if, for example, arylamine units, arylphosphine units, certain heterocycles (i.e. conjugation via N, O or S atoms) and/or organometallic complexes (i.e. conjugation via the metal atom) are located in the main chain. An analogous situation applies to conjugated dendrimers. By contrast, units such as, for example, simple alkyl bridges, (thio)ether, ester, amide or imide links are clearly defined as non-conjugated segments. A partially conjugated polymer in the sense of the present application is intended to be taken to mean a polymer which contains conjugated regions which are separated from one another by non-conjugated sections, specific conjugation interrupters (for example spacer groups) or branches, for example in which relatively long conjugated sections in the main chain are interrupted by non-conjugated sections, or which contains relatively long conjugated sections in the side chains of a polymer which is non-conjugated in the main chain. Conjugated and partially conjugated polymers may also comprise conjugated, partially conjugated or other dendrimers.

The term "dendrimer" in the present application is intended to be taken to mean a highly branched compound built up from a multifunctional centre (core) to which branched monomers are bonded in a regular structure, giving a tree-like structure. Both the centre and the monomers here may adopt any desired branched structures which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

In a further preferred embodiment of the present application, units of the formula (1) are conjugated with the main polymer chain. This can be achieved on the one hand by these units being incorporated into the main chain of the polymer in such a way that the conjugation of the polymer, as described above, is thereby retained. On the other hand, these units can also be linked into the side chain of the polymer in such a way that conjugation with the main chain of the polymer exists. This is the case, for example, if the linking to the main chain takes place only via $sp^2$-hybridised (or optionally also via sp-hybridised) carbon atoms, which may also be replaced by corresponding heteroatoms. However, if the linking takes place through units such as, for example, simple (thio)ether bridges, esters, amides or alkylene chains, the units of the formula (1) are defined as non-conjugated with the main chain.

An aryl group or heteroaryl group in the sense of the present application is taken to mean an aromatic group or heteroaromatic group respectively having a common aromatic electron system, where an aryl group includes 6 to 24 C atoms and a heteroaryl group includes 2 to 23 C atoms and in total at least 5 aromatic ring atoms. The heteroatoms are preferably selected from N, O and/or S. For the purposes of the present application, this can be a simple homo- or heterocycle, for example benzene, pyridine, thiophene, etc., or it can be a condensed aromatic ring system in which at least two aromatic or heteroaromatic rings, for example benzene rings, are "fused" to one another, i.e. are condensed onto one another by anellation, i.e. have at least one common edge and thus also a common aromatic system. This aryl or heteroaryl group may be substituted or unsubstituted; any substituents present may likewise form further ring systems. Thus, for example, systems such as naphthalene, anthracene, phenanthrene, pyrene, etc., are to be regarded as aryl groups and quinoline, acridine, benzothiophene, carbazole, etc., are to be regarded as heteroaryl groups in the sense of the present application, while, for example, biphenyl, fluorene, spirobifluorene, etc., are not aryl groups since they involve separate aromatic electron systems.

An aromatic ring system in the sense of the present application contains 6 to 40 C atoms in the ring system. A heteroaromatic ring system in the sense of the present application contains 2 to 40 C atoms and at least one heteroatom in the ring system, with the proviso that the sum of the C atoms and heteroatoms is at least 5. The heteroatoms are preferably selected from N, O and/or S. An aromatic or heteroaromatic ring system in the sense of the present application is intended to be taken to mean a system which does not necessarily contain only aryl or heteroaryl groups, but instead in which a plurality of aryl or heteroaryl groups may also be interrupted by a short non-aromatic unit (less than 10% of the atoms other than H, preferably less than 5% of the atoms other than H), such as, for example, an $sp^3$-hybridised C, N or O atom. Thus, for example, systems such as 9,9'-spirobifluorene, 9,9-diarylfluorene, triarylamine, diaryl ether, etc., are also intended to be regarded as aromatic ring systems in the sense of the present application.

For the purposes of the present application, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is particularly preferably taken to mean methoxy, ethoxy, n-propoxy, i-propoxy, n-butoxy, i-butoxy, s-butoxy, t-butoxy or 2-methylbutoxy. A $C_6$-$C_{24}$ aryl or $C_2$-$C_{23}$-heteroaryl group, which may be monovalent or divalent depending on the use, which may in each case also be substituted by the above-mentioned radicals $R^1$ and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole. Apart from the above-mentioned aryl and heteroaryl groups, aromatic and heteroaromatic ring systems in the sense of the present application are taken to mean, for example, biphenylene, terphenylene, fluorene, spirobifluorene, dihydrophenanthrene, tetrahydropyrene and cis- or trans-indenofluorene.

Preference is given to compounds of the formula (1) in which the symbol Y stands for nitrogen (N), phosphorus (P) or P=O, particularly preferably for nitrogen. The choice of the unit Y here depends on the desired function of the compound of the formula (1). If the compound of the formula (1) is intended to be employed as emitter in an emission layer or as hole-transport material, for example in a hole-transport or hole-injection layer, the symbol Y preferably stands for nitrogen or phosphorus, particularly preferably for nitrogen. If the compound of the formula (1) is intended to be employed as matrix material for phosphorescent emitters in an emission layer or as electron-transport and/or hole-blocking material, for example in an electron-transport layer or in a hole-blocking layer, for phosphorescent or fluorescent devices, the symbol Y preferably stands for P=O.

Preference is furthermore given to compounds of the formula (1) in which the symbols $Ar^1$, $Ar^2$ and $Ar^3$ stand, identically or differently on each occurrence, for a $C_6$-$C_{16}$-aryl- or $C_2$-$C_{15}$-heteroaryl group having 6 or 5 to 16 aromatic ring atoms respectively, which may be substituted by one or two radicals $R^1$, particularly preferably for an aryl or heteroaryl group selected from benzene, naphthalene, anthracene, phenanthrene, pyridine, pyrene and thiophene, in particular benzene, each of which may be substituted by one or two radicals $R^1$.

Particular preference is thus given to compounds of the formulae (5) to (7), formula (5)

-continued formula (6)

formula (7)

where the symbols and indices used have the same meaning as described above, and where each of the phenylene groups may also be substituted by one or more radicals $R^1$.

Preference is furthermore given to compounds of the formula (1) in which the symbols $Ar^4$ and $Ar^5$ stands, identically or differently on each occurrence, for an aromatic ($C_6$-$C_{16}$) or heteroaromatic ($C_2$-$C_{15}$) ring system having 5 to 16 aromatic ring atoms or for spirobifluorene, each of which may be substituted by one or more radicals $R^1$, particularly preferably for an aromatic or heteroaromatic ring system selected from benzene, naphthalene, anthracene, phenanthrene, pyridine, pyrene and thiophene, in particular benzene, each of which may be substituted by one or two radicals $R^1$.

Preference is furthermore given to compounds of the formula (1) in which the symbol $R^1$ stands, identically or differently on each occurrence, for H, F, CN, $Si(R^2)_3$, a straight-chain alkyl group having 1 to 5 C atoms or a branched alkyl group having 3 to 5 C atoms, where one or more non-adjacent $CH_2$ groups may be replaced by $Si(R^2)_2$, —$R^2C$=$CR^2$—, —C≡C—, —O— or —S— and where one or more H atoms may be replaced by F, or a monovalent $C_6$-$C_{16}$-aryl or $C_2$-$C_{15}$-heteroaryl group having 5 to 16 aromatic ring atoms, which may be substituted by one or more radicals $R^2$, particularly preferably for H, F, CN, $Si(Me)_3$, methyl, tert-butyl, a phenyl group or a monovalent heteroaryl group having 5 or 6 aromatic ring atoms, each of which may be substituted by one or more radicals $R^2$. $R^1$ is very particularly preferably =H if it is bonded directly to one of the groups $Ar^1$ to $Ar^4$. $R^1$, if it is bonded to the group $X^1$, $X^2$ and/or $X^3$, is particularly preferably, identically or differently on each occurrence, methyl, tert-butyl, a phenyl group, which may be substituted by one or more $C_1$- to $C_4$-alkyl groups, or a monovalent heteroaryl group having 5 or 6 aromatic ring atoms, which may be substituted by one or more $C_1$- to $C_4$-alkyl groups, very particularly preferably methyl or a phenyl group, which may be substituted by one or more $C_1$- to $C_4$-alkyl groups. Two or more radicals $R^1$ here may in each case also form a ring system with one another.

Preference is furthermore given to compounds of the formula (1) in which the symbols $X^1$, $X^2$ and $X^3$ are on each occurrence, identically or differently, a bridge which forms a cyclic system with $Ar^1$ and $Ar^2$ or with $Ar^2$ and $Ar^3$, selected from $C(R^1)_2$, C=O, C=$NR^1$, O, S, S=O, $SO_2$, $N(R^1)$, $P(R^1)$, P(=O)$R^1$, $C(R^1)_2$—$C(R^1)_2$, $C(R^1)_2$—$C(R^1)_2$—$C(R^1)_2$, $C(R^1)_2$—O, $C(R^1)_2$—O—$C(R^1)_2$. Particular preference is given to compounds of the formula (1) in which the symbols $X^1$, $X^2$ and $X^3$ are selected on each occurrence, identically or differently, from $C(R^1)_2$, $N(R^1)$, $P(R^1)$ and P(=O)($R^1$). Very particular preference is given to $C(R^1)_2$.

Preference is furthermore given to compounds in which n=0 and o=1, but also compounds in which n=1 and o=0.

Particular preference is thus given to compounds of the formulae (5a) to (5d), (6a) to (6d) or (7a) to (7d), formula (5a)

formula (5b)

formula (5c)

formula (5d)

formula (6a)

formula (6b)

formula (6c)

formula (6d)

formula (7a)

formula (7b)

formula (7c)

formula (7d)

where the symbols and indices used have the same meaning as described above, and where each of the phenyl and phenylene groups may also be substituted by one or more radicals $R^1$.

Very particular preference is given to polymers comprising structural units of the formula (7a), (7c) and (7d) selected from the following sub-formulae:

(7a1)

(7a2)

(7a3)

(7c1)

(7c2)

(7c3)

(7d1)

-continued (7d2)

(7d3)

where the dashed lines on the phenylene rings represent the linking in the polymer (and not methyl groups). Possible and/or preferred further substituents $R^1$ on the aromatic rings are not indicated for clarity.

Besides one or more structural units of the formula (1), the polymers according to the invention may also comprise further structural units. These are, inter alia, those as disclosed and listed extensively, for example, in WO 02/077060 A1 and in WO 2005/014689 A2. These are incorporated into the present application by way of reference. The further structural units can originate, for example, from the following classes:

Group 1: Units which influence the hole-injection and/or hole-transport properties of the polymers;
Group 2: Units which influence the electron-injection and/or electron-transport properties of the polymers;
Group 3: Units which have combinations of individual units from group 1 and group 2;
Group 4: Units which modify the emission characteristics to such an extent that electrophosphorescence can be obtained instead of electrofluorescence;
Group 5: Units which improve the transfer from the so-called singlet state to the triplet state;
Group 6: Units which influence the emission colour of the resultant polymers;
Group 7: Units which are typically used as backbone;
Group 8: Units which influence the film-morphological properties and/or the rheological properties of the resultant polymers.

Preferred polymers according to the invention are those in which at least one structural unit has charge-transport properties, i.e. which comprise units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −2.5 eV (against vacuum level), particularly preferably less than −2.7 eV.

It may be preferred for the polymers according to the invention to comprise units from group 3 containing structures which increase the hole mobility and structures which influence or increase the electron mobility (i.e. units from groups 1 and 2) are bonded directly to one another or structures which influence or increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as disclosed, for example, in WO 02/068435 A1, WO 02/081488 A1, EP 1239526 A2 and WO 2004/026886 A2. Corresponding monomers are disclosed in WO 02/068435 A1 and in WO 2005/042548 A1.

Structural units from group 5 are those which improve the transfer from the singlet state to the triplet state and which, employed in support of the structural units from group 4, improve the phosphorescence properties of these structural elements. Suitable for this purpose are, in particular, carbazole and bridged carbazole dimer units, as disclosed, for example, in WO 2004/070772 A2 and WO 2004/113468 A1. Also suitable for this purpose are ketones, phosphine oxides, sulfoxides, sulfones, silane derivatives and similar compounds, as disclosed, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence the singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological properties and/or the rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which simultaneously additionally comprise one or more units selected from groups 1 to 8 besides structural units of the formula (1). It may likewise be preferred for more than one structural unit from one group to be present simultaneously.

However, a smaller proportion of the emitting units, in particular green- and red-emitting units, may also be preferred, for example for the synthesis of white-emitting copolymers. The way in which white-emitting copolymers can be synthesised is disclosed in detail, for example, in WO 2005/030827 A1 and WO 2005/030828 A1.

Preference is given here to polymers according to the invention which, besides at least one structural unit of the formula (1), also comprise units from group 7, particularly preferably at least 50 mol % of these units.

It is likewise preferred for the polymers according to the invention to comprise units which improve the charge transport and/or charge injection, i.e. units from groups 1 and/or 2; a proportion of 0.5 to 30 mol % of these units is particularly preferred; a proportion of 1 to 10 mol % of these units is very particularly preferred.

It is furthermore particularly preferred for the polymers according to the invention to comprise structural units from group 7 and units from groups 1 and/or 2, in particular at least 50 mol % of units from group 7 and 0.5 to mol % of units from groups 1 and/or 2.

The requisite solubility of the polymers is ensured, in particular, by the substituents on the various recurring units, both the substituents on the structural units of the formula (1) and also by the substituents on the other recurring units.

The polymers according to the invention are either homopolymers comprising structural units of the formula (1) or copolymers. The polymers according to the invention can be linear, branched or crosslinked. Besides one or more structural units of the formula (1), or preferred sub-formulae thereof, copolymers according to the invention may potentially have one or more further structures from groups 1 to 8 mentioned above.

The copolymers according to the invention may have random, alternating or block-like structures or have a plurality of these structures in an alternating arrangement. The way in which copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the polymer may also have dendritic structures.

The polymers according to the invention comprising structural units of the formula (1) are accessible readily and in high yields. They preferably exhibit blue luminescence in the solid state.

The polymers according to the invention have advantageous properties, in particular long lifetimes, high efficiencies and good colour coordinates.

The polymers according to the invention are generally prepared by polymerisation of one or more types of monomer, of which at least one monomer results in structural units of the formula (1) in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of the SUZUKI coupling, the YAMAMOTO coupling and the STILLE coupling, and the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

For the synthesis of the polymers according to the invention, the corresponding monomers are required. Monomers which result in structural units of the formula (1) in the polymers according to the invention are indeno-fluorenarylamin derivatives, which are optionally correspondingly substituted and have suitable functionalities in one, two, three or four, preferably two or three, positions, which allow this monomer unit to be incorporated into the polymer. These monomers are novel and are therefore likewise a subject-matter of the present invention.

The present invention thus furthermore relates to compounds of the formulae (8) to (10) and preferably compounds of the formulae (11) to (13), which are characterised in that the radicals $Z^1$, $Z^2$ and $Z^3$ are, identically or differently, functional groups which polymerise under the conditions of the C—C or C—N linking reactions, where the other symbols and indices have the same meanings as in relation to the structural units of the formulae (1) to (7).

The functional groups $Z^1$, $Z^2$ and $Z^3$ are preferably selected from Cl, Br, I, O-tosylate, O-triflate, O—$SO_2R^2$, $B(OR^2)_2$ and $Sn(R^2)_3$, particularly preferably from Br, I and $B(OR^2)_2$, where $R^2$ is on each occurrence, identically or differently, H, an aliphatic or aromatic hydrocarbon radical having 1 to 20 C atoms, and where two or more radicals $R^2$ may also form a ring system with one another.

The same preference applies to the bifunctional monomeric compounds of the formulae (8) to (10) and (11) to (13) as described for the structural units of the formulae (1) to (7) above.

The synthesis of the units from groups 1 to 8 described above and the further emitting units is known to the person skilled in the art and is described in the literature, for example in WO 2005/014689 A2, WO 2005/030827 A1 and WO 2005/030828 A1. These documents and the literature cited therein are incorporated into the present application by way of reference.

It may additionally be preferred to use the polymers according to the invention not as the pure substance, but instead as a blend (mixture) together with further polymeric, oligomeric, dendritic or low-molecular-weight substances of any desired type. These may, for example, improve the electronic properties or themselves emit. Above and below, a blend denotes a mixture comprising at least one polymeric component.

The present invention thus furthermore relates to a polymer blend comprising one or more polymers according to the invention and one or more further polymeric, oligomeric, dendritic or low-molecular-weight substances.

The present invention furthermore relates to solutions and formulations comprising one or more polymers or blends according to the invention in one or more solvents. The way in which solutions of this type can be prepared is known to the person skilled in the art and is described, for example, in WO 02/072714 A1, WO 03/019694 A2 and the literature cited therein.

These solutions can be used to produce thin polymer layers, for example by area-coating processes (for example spin coating) or by printing processes (for example ink-jet printing).

Polymers comprising structural units of the formula (1) which contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to polymers according to the invention containing one or more crosslinkable groups selected from acrylate, methacrylate, vinyl, epoxy and oxetane. It is possible here not only to use corresponding polymers as the pure substance, but also to use formulations or blends of these polymers as described above. These can be used with or without addition of solvents and/or binders. Suitable materials, processes and devices for the methods described above are disclosed, for example, in WO 2005/083812 A2. Possible binders are, for example, polystyrene, polycarbonate, polyacrylates, polyvinylbutyral and similar, opto-electronically neutral polymers.

Suitable and preferred solvents are, for example, toluene, anisole, xylene, methyl benzoate, dimethylanisole, mesitylene, tetralin, veratrol and tetrahydrofuran. However, it is also possible to use solvent mixtures comprising two or more of the above-mentioned solvents.

The polymers, blends and formulations according to the invention can be used in electronic or opto-electronic devices or for the production thereof.

The present invention thus furthermore relates to the use of the polymers, blends and formulations according to the invention in electronic or opto-electronic devices, preferably in organic or polymeric light-emitting diodes (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric light-emitting diodes (OLEDs, PLEDs), in particular in polymeric light-emitting diodes (PLEDs).

The way in which OLEDs or PLEDs can be produced is known to the person skilled in the art and is disclosed in detail, for example, as a general process in WO 2004/070772 A2, which should be adapted correspondingly for the individual case.

As described above, the polymers according to the invention are very particularly suitable as electroluminescent materials in PLEDs or displays produced in this way.

Electroluminescent materials in the sense of the present application are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or blends according to the invention in a PLED, in particular as electroluminescent material.

The present invention furthermore relates to electronic or opto-electronic components, preferably organic or polymeric light-emitting diodes (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably organic or polymeric light-emitting diodes, in particular polymeric light-emitting diodes, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to PLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention in greater detail without restricting it. In particular, the features, properties and advantages described therein of the defined compounds on which the relevant example is based can also be applied to other compounds which are not described in detail, but fall within the scope of protection of the claims, unless stated otherwise elsewhere.

EXAMPLES 1 AND 2

Preparation of the Monomers

Example 1

Preparation of N,N'-[4,4'dibromophenyl)-2-aminobenzoindenofluorene 2

The compound is prepared as follows:

1.1 N,N'-[4,4'dibromophenyl)-2-aminobenzoindenofluorene 2

20 g (1 molar equivalent, 37.9 mmol) of N,N-diphenyl-2-aminobenzoindenofluorene 1 are dissolved in 300 ml of chloroform, and 37.5 g of tetrabutylammonium tribromide (2 molar equivalents, 77.8 mmol) are added in portions at room temperature. The batch is stirred at room temperature for 2 hours. 10% sodium thiosulfate solution is subsequently added. The phases are separated, the aqueous phase is extracted with dichloromethane. The combined organic phases are washed three times with 100 ml of water, dried over magnesium sulfate, filtered, and the solvent is stripped off in vacuo, giving 35 g of a pale-yellow solid.

$^1$H NMR (CDCl$_3$, δ (ppm), J (Hz)): 1.55 (s, 6H), 1.63 (s, 6H), 6.93 (d, 4H, J=9 Hz), 7.29 (d, 4H, J=9 Hz), 7.34 (d, 1H, J=9 Hz), 7.37 (t, 1H, J=9 Hz), 7.43 (t, 1H, J=8 Hz), 7.48 (d, 1H, J=9 Hz), 7.68 (t, 1H, J=9 Hz), 7.79 (d, 1H, J=9 Hz), 7.84 (s, 1H), 7.96 (d, 1H, J=9 Hz), 8.33 (s, 1H), 8.86 (d, 1H, J=9 Hz).

Example 2

N,N'-[4,4'Dibromophenyl)-9-amino-2-bromobenzo-indenofluorene 4

Compound 4 is prepared analogously to compound 2, using three equivalents of tetrabutylammonium tribromide:

$^1$H NMR (CDCl$_3$, δ (ppm), J (Hz)): 1.56 (s, 6H), 1.60 (s, 6H), 7.00 (d, 4H, J=9 Hz), 7.04 (d, 1H, J=9 Hz), 7.18 (d, 1H, J=9 Hz), 7.35 (d, 4H, J=9 Hz), 7.53 (t, 1H, J=9 Hz), 7.62 (d, 1H, J=8 Hz), 7.67 (d, 1H, J=9 Hz), 7.77 (s, 1H), 7.84 (d, 1H, J=9 Hz), 7.95 (d, 1H, J=9 Hz), 8.30 (s, 1H), 8.79 (d, 1H, J=9 Hz).

EXAMPLES 3 TO 6

Preparation of the Polymers

Polymers P1 and P2 according to the invention and comparative polymers C1 and C2 are synthesised by SUZUKI coupling in accordance with WO 03/048225 A2 using the following monomers (percent data=mol %).

Example 3

Polymer P1

-continued

2%

Example 4

Polymer P2

50%

47%

-continued

2%

1%

Example 5

Comparative Polymer C1

50%

48%

-continued

2%

2%

Example 6

Comparative Polymer C2

50%

2%

EXAMPLES 7 TO 10

Production of the PLED Devices

Figure 1:
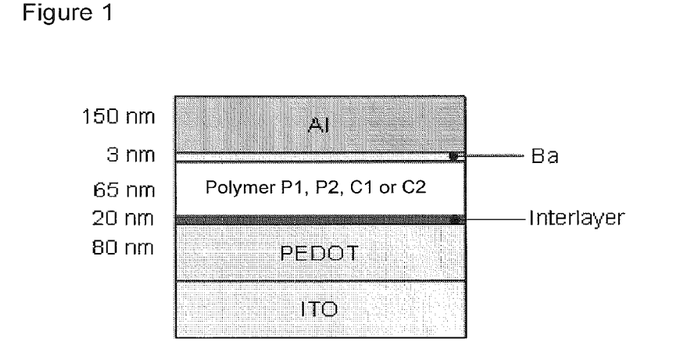
FIG. 1 illustrates a typical device to produce PLEDs.

A polymeric organic light-emitting diode (PLED) is produced as already described many times in the literature (for example in WO 2004/037887 A2). In order to explain the present invention in illustrative terms, PLEDs are produced with polymers P1 and P2 and comparative polymers C1 and C2 by spin coating. A typical device has the structure depicted in FIG. 1.

Figure 2:
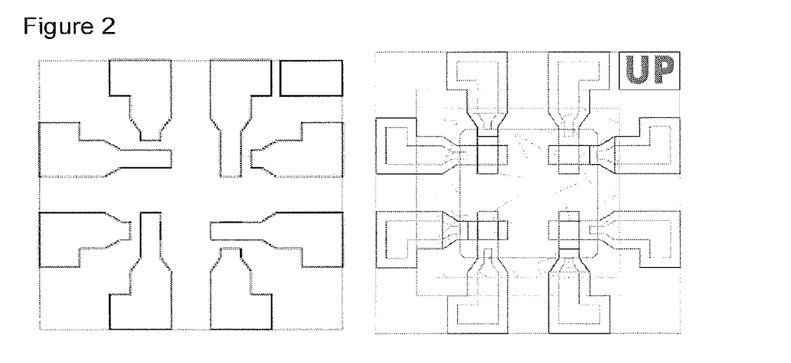
FIG. 2 illustrates on the diagram on the left: ITO structure applied to the glass support, diagram on the right: complete electronic structure with ITO, vapor-deposited cathode and optional metallization of the leads.

To this end, specially manufactured substrates from Technoprint are used in a layout designed specifically for this purpose (FIG. 2, diagram on the left: ITO structure applied to the glass support, diagram on the right: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in a clean room. The spin rate required depends on

46% the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (nitrogen or argon), firstly 20 nm of an interlayer (typically a hole-dominated polymer, here HIL-012 from Merck) and then 65 nm of the polymer layers are applied from toluene solutions (concentration of interlayer 5 g/l, for polymers P1 and P2 as well as C1 and C2 8 g/l in each case). Both layers are dried by heating at 180° C. for at least 10 minutes. The Ba/Al cathode is then vapour-deposited in the pattern indicated through a vapour-deposition mask (high-purity metals from Aldrich, particularly barium 99.99% (Order No. 474711); vapour-deposition units from Lesker or others, typical vacuum level 5×10$^{-6}$ mbar). Finally, the device is encapsulated in order to protect, in particular, the cathode against air and atmospheric moisture. The device is encapsulated by sticking a commercially available cover slip over the pixelated area. The device is subsequently characterised.

Figure 3:
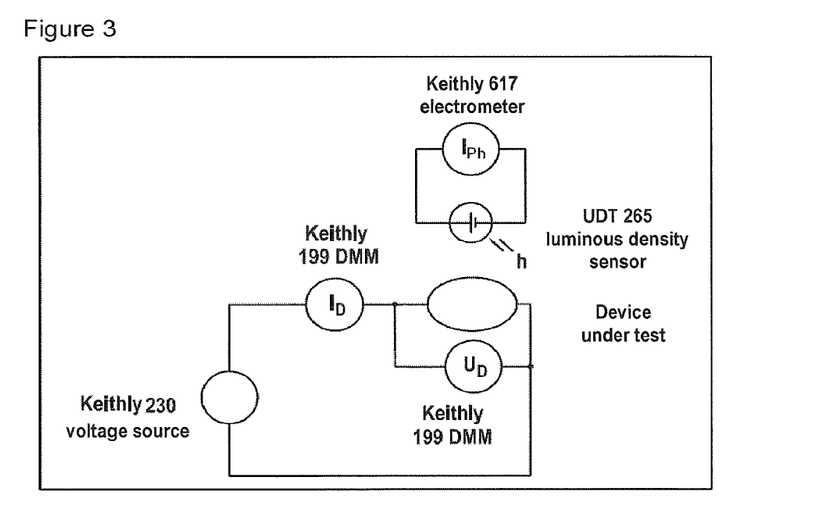
FIG. 3 illustrates the typical measurement set-up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m$^2$.

In order, in addition, to know the colour and the precise electroluminescence spectrum of the test devices, the voltage required for 100 cd/m$^2$ is applied again after the first measurement, and the photodiode is replaced by a spectrum measurement head. This is connected to a spectrometer (Ocean Optics) by an optical fibre. The colour coordinates (CIE: Commission Internationale de l'Éclairage, standard observer from 1931) can be derived from the measured spectrum.

Of particular importance for the usability of materials is the lifetime of the device. This is measured in a measurement set-up which is very similar to the first evaluation by setting an initial luminous density (for example 1000 cd/m$^2$). The current required for this luminous density is kept constant, while the voltage typically increases and the luminous density typically decreases. The lifetime has been reached when the initial luminous density has dropped to 50% of the initial value.

The results obtained on use of polymers P1 and P2 as well as C1 and C2 in PLEDs are summarised in Table 1.

TABLE 1

| Ex. | Polymer | Max. eff. [cd/A] | U @ 100 cd/m$^2$ [V] | CIE [x/y] | Lifetime [h @ cd/m$^2$] |
|---|---|---|---|---|---|
| 7 | P1 | 8.35 | 4.29 | 0.17/0.20 | 1000 @ 1000 |
| 8 | P2 | 5.85 | 3.89 | 0.15/0.11 | 1200 @ 1000 |
| 9 | C1 | 4.57 | 5.04 | 0.15/0.15 | 80 @ 1000 |
| 10 | C2 | 6.97 | 4.88 | 0.16/0.24 | 167 @ 1000 |

As can be seen from the results, polymers P1 to P2 represent a significant improvement in efficiency and lifetime compared with the comparative polymers. The novel polymers according to the invention are consequently significantly more suitable for use in displays and lighting applications than polymers in accordance with the prior art.

The invention claimed is:

1. A polymer comprising 0.01 to 100 mol % of one or more structural units of the formula (7c) or (7d), formula (7c)

formula (7d)

where the symbols and indices used have the following meanings:

R$^1$ is on each occurrence, identically or differently, H, F, Cl, Br, I, CN, NO$_2$, Si(R$^2$)$_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by —R$^2$C=CR$^2$—, Si(R$^2$)$_2$, Ge(R$^2$)$_2$, Sn(R$^2$)$_2$, C=O, C=S, C=Se, C=NR$^2$, —O—, —S— or —CONR$^2$— and where one or more H atoms is optionally replaced by F, Cl, Br, I, CN or NO$_2$, or an aromatic or heteroaromatic ring system having 5 to 40 aromatic ring atoms, which is optionally substituted by one or more radicals R$^2$, or an aryloxy or heteroaryloxy group having 5 to 40 aromatic ring atoms, which is optionally substituted by one or more radicals R$^2$, or a combination of these systems; two or more substituents R$^1$ here optionally also form a mono- or polycyclic, aliphatic, aromatic or heteroaromatic ring system with one another;

R$^2$ is on each occurrence, identically or differently, H, an aliphatic hydrocarbon radical having 1 to 20 C atoms or an aromatic hydrocarbon radical having 6 to 20 C atoms;

X$^1$ is on each occurrence, identically or differently, selected from B(R$^1$), C(R$^1$)$_2$, Si(R$^1$)$_2$, C=O, C=NR$^1$, C=C(R$^1$)$_2$, O, S, S=O, SO$_2$, N(R$^1$), P(R$^1$), P(=O)R$^1$, P(=S)R$^1$ or a combination of two, three or four of these groups;

X$^2$ is on each occurrence, identically or differently, selected from B(R$^1$), C(R$^1$)$_2$, Si(R$^1$)$_2$, C=O, C=NR$^1$, C=C(R$^1$)$_2$, O, S, S=O, SO$_2$, N(R$^1$), P(R$^1$), P(=O)R$^1$, P(=S)R$^1$ or a combination of two, three or four of these groups; and wherein the dashed lines denote the links in the polymer and the polymer has 10 to 10,000 recurring units.

2. The polymer according to claim 1, wherein the polymer comprises further structural units besides the units of the formula (7c) or (7d).

3. The polymer according to claim 2, wherein the further structural units, which have hole-injection and/or hole-transport properties, are triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole or furan derivatives or further O-, S- or N-containing heterocycles having a high HOMO.

4. The polymer according to claim 2, wherein the further structural units, which have electron-injection and/or electron-transport properties, are pyridine, pyrimidine, pyridazine, pyrazine, oxadiazole, quinoline, quinoxaline, anthracene, benzanthracene, pyrene, perylene, benzimidazole, triazine, ketone, phosphine oxide or phenazine derivative, triarylborane or further O-, S- or N-containing heterocycles having a low LUMO.

5. The polymer according to claim 2, wherein the further structural elements modify the emission characteristics to such an extent that electrophosphorescence can be obtained instead of electrofluorescence.

6. The polymer according to claim 2, wherein the further structural elements, which improve the transfer from the singlet state to the triplet state, are selected from the classes of the carbazole and bridged carbazole dimer units, ketones, phosphine oxides, sulfoxides, sulfones and silane derivatives.

7. The polymer according to claim 2, wherein the further structural elements, which influence the emission colour of the polymers, are 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives.

8. The polymer according to claim 2, wherein the further structural elements, which are typically used as backbone, are selected from the classes of the 4,5-dihydropyrene, 4,5,9,10-tetrahydropyrene, fluorene, 9,9'-spirobifluorene, phenanthrene, 9,10-dihydrophenanthrene, 5,7-dihydrodibenzoxepine and cis- or trans-indenofluorene derivatives.

9. A process for the preparation of the polymer according to claim 1, which comprises preparing the polymer according to claim 1 by SUZUKI polymerisation, YAMAMOTO polymerisation, STILLE polymerisation or HARTWIG-BUCHWALD polymerisation.

10. A mixture of one or more polymers according to claim 1 with further polymeric, oligomeric, dendritic and/or low-molecular-weight substances.

11. A solution or formulation comprising the mixture according to claim 10 in one or more solvents.

12. An organic electronic device comprising one or more active layers, wherein at least one of said active layers comprises the mixture according to claim 10.

13. A solution or formulation comprising one or more polymers according to claim 1 in one or more solvents.

14. An organic electronic device comprising one or more active layers, wherein at least one of said active layers comprises one or more polymers according to claim 1.

15. The organic electronic device according to claim 14, wherein the organic device is an organic or polymeric organic light-emitting diode, an organic integrated circuit, an organic field-effect transistor, an organic thin-film transistor, an organic solar cell, an organic laser diode, an organic photovoltaic element or device or an organic photoreceptor.

16. The polymer according to claim 1, wherein the polymer has 20 to 5,000 recurring units.

17. The polymer according to claim 1, wherein the polymer has 50 to 2,000 recurring units.

18. A polymer comprising 0.01 to 100 mol % of one or more structural units of the formula (7), formula (7)

where the symbols and indices used have the following meanings:

Y is on each occurrence N, P, P=O, $PF_2$, P=S, As, As=O, As=S, Sb, Sb=O or Sb=S;

$Ar^4$ and $Ar^v$ is on each occurrence, identically or differently, an aromatic or heteroaromatic ring system having 5 to 40 aromatic ring atoms, which is optionally substituted by one or more radicals $R^1$;

$R^1$ is on each occurrence, identically or differently, F, Cl, Br, I, CN, $NO_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by —$R^2C$=$CR^2$—, $Si(R^2)_2$, $Ge(R^2)_2$, $Sn(R^2)_2$, C=O, C=S, C=Se, C=$NR^2$, —O—, —S— or —$CONR^2$— and where one or more H atoms is optionally replaced by F, Cl, Br, I, CN or $NO_2$, or an aromatic or heteroaromatic ring system having 5 to 40 aromatic ring atoms, which is optionally substituted by one or more radicals $R^2$, or an aryloxy or heteroaryloxy group having 5 to 40 aromatic ring atoms, which is optionally substituted by one or more radicals $R^2$, or a combination of these systems; two or more substituents $R^1$ here optionally also form a mono- or polycyclic, aliphatic, aromatic or heteroaromatic ring system with one another;

$R^2$ is on each occurrence, identically or differently, H, an aliphatic hydrocarbon radical having 1 to 20 C atoms or an aromatic hydrocarbon radical having 6 to 20 C atoms;

$X^1$ is on each occurrence, identically or differently, a bridge which, with $Ar^1$ and $Ar^2$, forms a cyclic system selected from $B(R^1)$, $C(R^1)_2$, $Si(R^1)_2$, C=O, C=$NR^1$, C=$C(R^1)_2$, O, S, S=O, $SO_2$, $N(R^1)$, $P(R^1)$, P(=O)$R^1$, P(=S)$R^1$ or a combination of two, three or four of these groups;

$X^2$ and $X^3$ is on each occurrence, identically or differently, a bridge which, with $Ar^2$ and $Ar^3$, forms a cyclic system selected from $B(R^1)$, $C(R^1)_2$, $Si(R^1)_2$, C=O, C=$NR^1$, C=$C(R^1)_2$, O, S, S=O, $SO_2$, $N(R^1)$, $P(R^1)$, P(=O)$R^1$, P(=S)$R^1$ or a combination of two, three or four of these groups;

n and o is on each occurrence, identically or differently, 0 or 1, with the proviso that the sum (n+o)=1; and
wherein the dashed lines denote the links in the polymer and the polymer has 10 to 10,000 recurring units and wherein the polymer comprises further structural units besides the units of the formula (7) and the further structural units are linked to the dashed lines in formula (7) by a C—C linkage.

19. A process for the preparation of the polymer according to claim 18, which comprises preparing the polymer according to claim 18 by SUZUKI polymerisation, YAMAMOTO polymerisation, STILLE polymerisation or HARTWIG-BUCHWALD polymerisation.

20. A mixture of one or more polymers according to claim 18 with further polymeric, oligomeric, dendritic and/or low-molecular-weight substances.

21. A solution or formulation comprising one or more polymers according to claim 18 in one or more solvents.

22. An organic electronic device comprising one or more active layers, wherein at least one of said active layers comprises one or more polymers according to claim 18.

23. The polymer according to claim 18, wherein the polymer has 20 to 5,000 recurring units.

24. The polymer according to claim 18, wherein the polymer has 50 to 2,000 recurring units.

25. The polymer according to claim 18, wherein $Ar^4$ and $Ar^5$ is identically or differently on each occurrence, an aromatic ($C_6$-$C_{16}$) or heteroaromatic ($C_2$-$C_{15}$) ring system having 5 to 16 aromatic ring atoms or for spirobifluorene, each of which is optionally substituted by one or more radicals $R^1$.

26. A polymer comprising 0.01 to 50 mol % of one or more structural units of the formula (6), formula (6)

where the symbols and indices used have the following meanings:

Y is on each occurrence N, P, P=O, $PF_2$, P=S, As, As=O, As=S, Sb, Sb=O or Sb=S;

$Ar^4$ and $Ar^5$ is on each occurrence, identically or differently, an aromatic or heteroaromatic ring system having 5 to 40 aromatic ring atoms, which is optionally substituted by one or more radicals $R^1$;

$R^1$ is on each occurrence, identically or differently, H, F, Cl, Br, I, CN, $NO_2$, $Si(R^2)_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by —$R^2$C=C$R^2$—, $Si(R^2)_2$, $Ge(R^2)_2$, $Sn(R^2)_2$, C=O, C=S, C=Se, C=N$R^2$, —O—, —S— or —CON$R^2$— and where one or more H atoms is optionally replaced by F, Cl, Br, I, CN or $NO_2$, or an aromatic or heteroaromatic ring system having 5 to 40 aromatic ring atoms, which is optionally substituted by one or more radicals $R^2$, or an aryloxy or heteroaryloxy group having 5 to 40 aromatic ring atoms, which is optionally substituted by one or more radicals $R^2$, or a combination of these systems; two or more substituents $R^1$ here optionally also form a mono- or polycyclic, aliphatic, aromatic or heteroaromatic ring system with one another;

$R^2$ is on each occurrence, identically or differently, H, an aliphatic hydrocarbon radical having 1 to 20 C atoms or an aromatic hydrocarbon radical having 6 to 20 C atoms;

$X^1$ is on each occurrence, identically or differently, a bridge which, with $Ar^1$ and $Ar^2$, forms a cyclic system selected from $B(R^1)$, $C(R^1)_2$, $Si(R^1)_2$, C=O, C=N$R^1$, C=C($R^1)_2$, O, S, S=O, $SO_2$, $N(R^1)$, $P(R^1)$, P(=O)$R^1$, P(=S)$R^1$ or a combination of two, three or four of these groups;

$X^2$ and $X^3$ is on each occurrence, identically or differently, a bridge which, with $Ar^2$ and $Ar^3$, forms a cyclic system selected from $B(R^1)$, $C(R^1)_2$, $Si(R^1)_2$, C=O, C=N$R^1$, C=C($R^1)_2$, O, S, S=O, $SO_2$, $N(R^1)$, $P(R^1)$, P(=O)$R^1$, P(=S)$R^1$ or a combination of two, three or four of these groups;

n and o is on each occurrence, identically or differently, 0 or 1, with the proviso that the sum (n+o)=1; and
wherein the dashed lines denote the links in the polymer and the polymer has 10 to 10,000 recurring units and wherein the polymer comprises further structural units besides the units of the formula (6) and the further structural units are linked to the dashed lines in formula (6) by a C—C linkage.

27. A polymer comprising 0.01 to 50 mol % of one or more structural units of the formula (6c) or 6(d), formula (6c)

formula (6d)

where the symbols and indices used have the following meanings:

$X^1$ is on each occurrence, identically or differently, forms a cyclic system selected from $B(R^1)$, $C(R^1)_2$, $Si(R^1)_2$, C=O, C=N$R^1$, C=C($R^1)_2$, O, S, S=O, $SO_2$, $N(R^1)$, $P(R^1)$, P(=O)$R^1$, P(=S)$R^1$ or a combination of two, three or four of these groups;

$X^2$ is on each occurrence, identically or differently, forms a cyclic system selected from $B(R^1)$, $C(R^1)_2$, $Si(R^1)_2$, C=O, C=NR$^1$, C=C(R$^1$)$_2$, O, S, S=O, SO$_2$, N(R$^1$), P(R$^1$), P(=O)R$^1$, P(=S)R$^1$ or a combination of two, three or four of these groups;

$R^1$ is on each occurrence, identically or differently, H, F, Cl, Br, I, CN, NO$_2$, Si(R$^2$)$_3$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent CH$_2$ groups is optionally replaced by —R$^2$C=CR$^2$—, Si(R$^2$)$_2$, Ge(R$^2$)$_2$, Sn(R$^2$)$_2$, C=O, C=S, C=Se, C=NR$^2$, —O—, —S— or —CONR$^2$— and where one or more H atoms is optionally replaced by F, Cl, Br, I, CN or NO$_2$, or an aromatic or heteroaromatic ring system having 5 to 40 aromatic ring atoms, which is optionally substituted by one or more radicals $R^2$, or an aryloxy or heteroaryloxy group having 5 to 40 aromatic ring atoms, which is optionally substituted by one or more radicals $R^2$, or a combination of these systems; two or more substituents $R^1$ here optionally also form a mono- or polycyclic, aliphatic, aromatic or heteroaromatic ring system with one another;

$R^2$ is on each occurrence, identically or differently, H, an aliphatic hydrocarbon radical having 1 to 20 C atoms or an aromatic hydrocarbon radical having 6 to 20 C atoms;

wherein the dashed lines denote the links in the polymer and the polymer has 10 to 10,000 recurring units.

\* \* \* \* \*